US012744506B2

(12) United States Patent
Daimon

(10) Patent No.: US 12,744,506 B2
(45) Date of Patent: Sep. 22, 2026

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 833 days.

(21) Appl. No.: 18/118,780

(22) Filed: Mar. 8, 2023

(65) Prior Publication Data

US 2023/0223912 A1 Jul. 13, 2023

Related U.S. Application Data

(63) Continuation of application No. PCT/JP2021/033133, filed on Sep. 9, 2021.

(30) Foreign Application Priority Data

Sep. 17, 2020 (JP) ................................ 2020-156591

(51) Int. Cl.
*H03H 9/02* (2006.01)
*H03H 9/13* (2006.01)
*H03H 9/17* (2006.01)

(52) U.S. Cl.
CPC .......... *H03H 9/02086* (2013.01); *H03H 9/13* (2013.01); *H03H 9/17* (2013.01)

(58) Field of Classification Search
CPC .. H03H 9/02086; H03H 3/08; H03H 9/02858; H03H 9/17; H03H 9/13; H03H 9/02881; H03H 9/02574
See application file for complete search history.

(56) References Cited

U.S. PATENT DOCUMENTS 7,939,989 B2 * 5/2011 Solal .................... H03H 9/1452 310/313 C
11,374,550 B2 * 6/2022 Daimon .................. H03H 9/25
(Continued)

FOREIGN PATENT DOCUMENTS

JP 2011101350 A 5/2011
JP 2012186808 A 9/2012
(Continued)

OTHER PUBLICATIONS

International Search Report in PCT/JP2021/033133, mailed Nov. 22, 2021, 3 pages.

(Continued)

*Primary Examiner* — J. San Martin
(74) *Attorney, Agent, or Firm* — Keating & Bennett, LLP

(57) ABSTRACT

An acoustic wave device includes a piezoelectric substrate and an IDT electrode including electrode fingers. A portion of the IDT electrode in which the electrode fingers overlap with each other in a propagation direction of an acoustic wave is an intersecting region. The intersecting region includes a central region on a center side in an extending direction of the electrode fingers, and a first region and a second region located on respective sides of the central region in the extending direction of the electrode fingers. In the central region, a dielectric film is provided between the electrode fingers, and the dielectric film does not overlap with at least a portion of the electrode fingers when seen in plan view.

20 Claims, 8 Drawing Sheets

(56) References Cited

U.S. PATENT DOCUMENTS

| | | | |
|---|---|---|---|
| 2011/0068655 | A1 | 3/2011 | Solal et al. |
| 2013/0051588 | A1 | 2/2013 | Ruile et al. |
| 2014/0001919 | A1 | 1/2014 | Komatsu et al. |
| 2019/0123713 | A1 | 4/2019 | Daimon |

FOREIGN PATENT DOCUMENTS

| | | | |
|---|---|---|---|
| JP | 2014131351 | A | 7/2014 |
| JP | 2019080093 | A | 5/2019 |
| WO | 2010100967 | A1 | 9/2010 |
| WO | 2012127793 | A1 | 9/2012 |

OTHER PUBLICATIONS

Written Opinion in PCT/JP2021/033133, mailed Nov. 22, 2021, 4 pages.

* cited by examiner

FIG. 9A
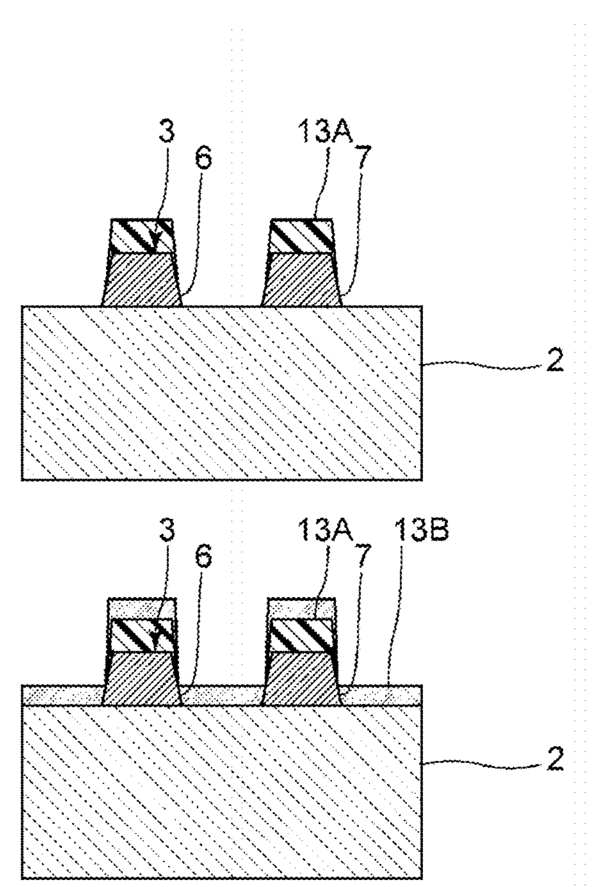
FIG. 9B
FIG. 10
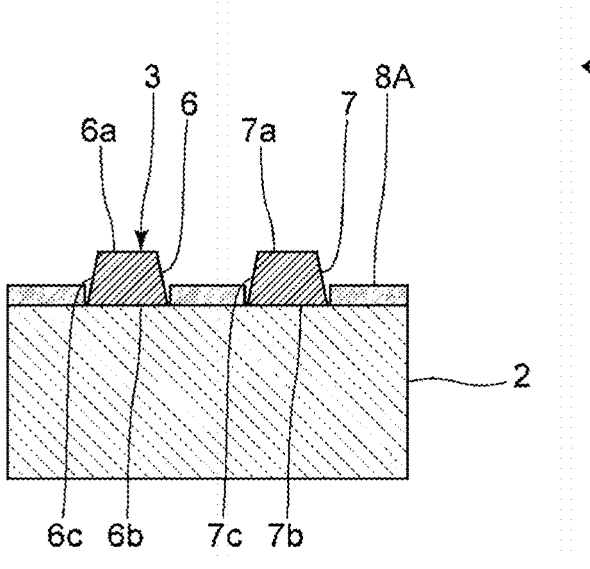

ACOUSTIC WAVE DEVICE

CROSS REFERENCE TO RELATED APPLICATIONS

This application claims the benefit of priority to Japanese Patent Application No. 2020-156591 filed on Sep. 17, 2020 and is a Continuation Application of PCT Application No. PCT/JP2021/033133 filed on Sep. 9, 2021. The entire contents of each application are hereby incorporated herein by reference.

BACKGROUND OF THE INVENTION

1. Field of the Invention

The present invention relates to an acoustic wave device.

2. Description of the Related Art

Conventionally, acoustic wave devices are widely used for filters of cellular phones or the like. Japanese Unexamined Patent Application Publication No. 2011-101350 discloses one example of an acoustic wave device. In this acoustic wave device, an interdigital transducer (IDT) electrode is provided on a piezoelectric substrate. In a direction in which a plurality of electrode fingers of the IDT electrode extend, a plurality of ranges having different acoustic velocities are provided. Specifically, a low acoustic velocity region is located at an outer side portion of a central region, and a high acoustic velocity region is located at an outer side portion of the low acoustic velocity region. As a result, a piston mode is achieved, thus a transverse mode being suppressed.

A band-shaped dielectric film is provided to the central region described above. The dielectric film covers the plurality of electrode fingers in the central region. Therefore, the acoustic velocity in the central region is increased, which brings difference in acoustic velocity between the central region and the low acoustic velocity region.

SUMMARY OF THE INVENTION

In order to suppress the transverse mode, it is ideal to have large difference in acoustic velocity between the central region and the low acoustic velocity region. However, in the acoustic wave device in Japanese Unexamined Patent Application Publication No. 2011-101350, it is difficult to make the difference in acoustic velocity between the central region and the low acoustic velocity region sufficiently large. Thus, there is a case where the transverse mode cannot sufficiently be suppressed.

Preferred embodiments of the present invention provide acoustic wave devices each capable of effectively suppressing a transverse mode.

An acoustic wave device according to a preferred embodiment of the present invention includes a piezoelectric substrate including a piezoelectric layer, and an IDT electrode. The IDT electrode is provided on the piezoelectric layer and includes a first busbar and a second busbar opposed to each other, and a plurality of electrode fingers each including one end connected to one of the first busbar and the second busbar. A portion of the IDT electrode in which the electrode fingers overlap with each other in a propagation direction of an acoustic wave is an intersecting region, the electrode fingers being adjacent to each other. The intersecting region includes a central region located on a center side in an extending direction of the plurality of electrode fingers, and a first region and a second region located on respective sides of the central region in the extending direction of the plurality of electrode fingers. A dielectric film located in the central region is further provided. In the central region, the dielectric film is provided between the plurality of electrode fingers, and the dielectric film does not overlap with at least a portion of the plurality of electrode fingers when seen in plan view.

The acoustic wave devices according to preferred embodiments of the present invention can each effectively suppress the transverse mode.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 9A and 9B are front sectional views around the pair of electrode fingers, and illustrate one example of a method of forming the dielectric film according to Preferred Embodiment 1 of the present invention.

FIG. 10 is a front sectional view illustrating around a pair of electrode fingers of an acoustic wave device according to Modification 1 of Preferred Embodiment 1 of the present invention.

DETAILED DESCRIPTION OF THE PREFERRED EMBODIMENTS

Hereinafter, detailed preferred embodiments of the present invention are described with reference to the drawings to reveal the present invention.

Note that the preferred embodiments described herein are merely examples, and it should be noted that partial replacement and combination of configurations are possible between different preferred embodiments.

Figure 1:
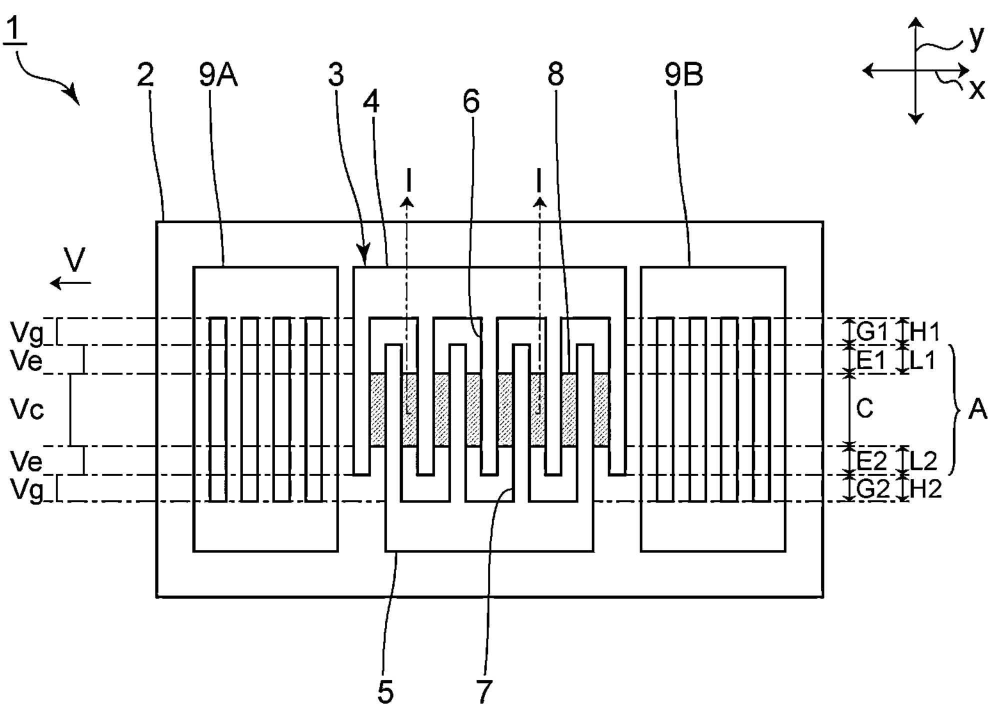
FIG. 1 is a plan view of an acoustic wave device according to Preferred Embodiment 1 of the present invention.

FIG. 1 is a plan view of an acoustic wave device according to Preferred Embodiment 1 of the present invention. In the plan views in FIG. 1 and other than FIG. 1, a dielectric film described later is indicated by hatching.

An acoustic wave device 1 includes a piezoelectric substrate 2. In this preferred embodiment, the piezoelectric substrate 2 is a piezoelectric substrate made only of a piezoelectric layer. Note that the piezoelectric substrate 2 may be a multilayer substrate including the piezoelectric layer. As material of the piezoelectric layer, for example, lithium tantalate, lithium niobate, zinc oxide, aluminum nitride, quartz, lead zirconate titanate (PZT), or the like can be used.

An IDT electrode 3 is provided on the piezoelectric substrate 2. The IDT electrode 3 includes a plurality of electrode fingers. More specifically, the plurality of electrode fingers are a plurality of first electrode fingers 6 and a plurality of second electrode fingers 7. By the IDT electrode 3 being applied with alternating-current voltage, an acoustic wave is excited. On the piezoelectric substrate 2, reflectors 9A and 9B are provided in a pair on respective sides of the IDT electrode 3 in a propagation direction of the acoustic wave. As described above, the acoustic wave device 1 of this preferred embodiment is a surface acoustic wave resonator. Note that the acoustic wave device according to the present invention is not limited to the acoustic wave resonator, but may be a filter device or a multiplexer having an acoustic wave resonator. Herein, the propagation direction of the acoustic wave is referred to as an x direction. The extending direction of the plurality of first electrode fingers 6 and the plurality of second electrode fingers 7 is referred to as a y direction. The x direction is perpendicular or substantially perpendicular to the y direction in this preferred embodiment.

The acoustic wave device 1 suppresses a transverse mode by generating a piston mode. In the acoustic wave device 1, a plurality of ranges having different acoustic velocities are arranged in the y direction. Specifically, from the center in the y direction, a central region C, a pair of low acoustic velocity regions L1 and L2, and a pair of high acoustic velocity regions H1 and H2 are arranged in this order. Therefore, a piston mode is achieved and a transverse mode can be suppressed. Note that the low acoustic velocity region L1 and the low acoustic velocity region L2 are ranges where the acoustic velocity therein is lower than the acoustic velocity in the central region C. The high acoustic velocity region H1 and the high acoustic velocity region H2 are ranges where the acoustic velocity therein is higher than the acoustic velocity in the central region C.

Characteristics of this preferred embodiment include that the central region C is provided with a dielectric film 8 between the plurality of electrode fingers, and when seen in plan view, the dielectric film 8 does not overlap with at least a portion of the plurality of electrode fingers in the central region C. Therefore, a difference in acoustic velocity between the central region C and the low acoustic velocity regions L1 and L2 can be increased. As a result, a transverse mode can effectively be suppressed. Details of the above-described effects will be described below together with details of configuration of this preferred embodiment.

As illustrated in FIG. 1, the IDT electrode 3 includes a first busbar 4 and a second busbar 5. The first busbar 4 and the second busbar 5 are opposed to each other. Each of the plurality of first electrode fingers 6 has one end connected to the first busbar 4. Each of the plurality of second electrode fingers 7 has one end connected to the second busbar 5. The plurality of first electrode fingers 6 and the plurality of second electrode fingers 7 interdigitate with each other.

Figure 2:
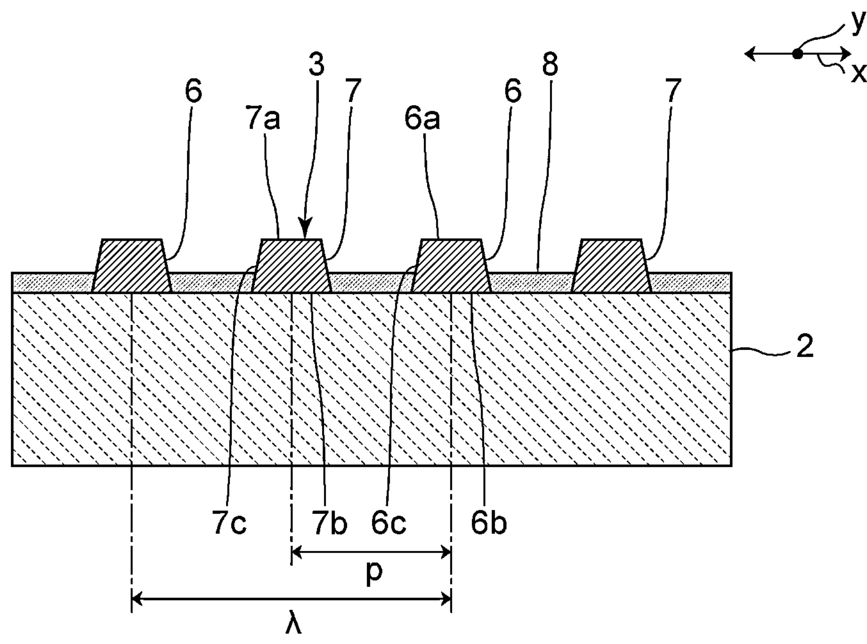
FIG. 2 is a sectional view taken along a line I-I in FIG. 1.

FIG. 2 is a sectional view taken along a line I-I in FIG. 1. Note that FIG. 2 is a sectional view of the central region C.

The first electrode finger 6 has a first surface 6*a*, a second surface 6*b*, and a side surface 6*c*. The first surface 6*a* and the second surface 6*b* are opposed to each other in a thickness direction. The side surface 6*c* is connected to the first surface 6*a* and the second surface 6*b*. Similarly, the second electrode finger 7 has a first surface 7*a*, a second surface 7*b*, and a side surface 7*c*. The IDT electrode 3, the reflector 9A, and the reflector 9B may each be made of a multilayer metal film or a single layer metal film.

Referring back to FIG. 1, a portion of the IDT electrode 3 where the first electrode finger 6 and the second electrode finger 7 overlap with each other in the x direction is an intersecting region A. The intersecting region A includes the central region C, a first region E1, and a second region E2. The central region C is located on a center side in the intersecting region A in the y direction. The first region E1 and the second region E2 are located on respective sides of the central region C in the y direction. More specifically, the first region E1 is located on the first busbar 4 side in the central region C. The second region E2 is located on the second busbar 5 side in the central region C.

In the central region C, the dielectric film 8 is provided between the first electrode finger 6 and the second electrode finger 7. More specifically, in this preferred embodiment, a plurality of dielectric films 8 extending in the y direction are provided. As illustrated in FIG. 2, the dielectric film 8 is in contact with the side surface 6*c* of the first electrode finger 6 and the side surface 7*c* of the second electrode finger 7. On the other hand, the dielectric film 8 is not in contact with the first surface 6*a* and the second surface 6*b* of the first electrode finger 6 and the first surface 7*a* and the second surface 7*b* of the second electrode finger 7. Note that the dielectric film 8 may be in contact with the first surface 6*a*, the first surface 7*a*, the second surface 6*b*, or the second surface 7*b*, as long as the dielectric film 8 does not overlap with at least a portion of the plurality of electrode fingers when seen in plan view.

FIG. 2 illustrates an example in which a film thickness of the dielectric film 8 is smaller than a film thickness of the first electrode finger 6 and the second electrode finger 7. Note that the film thickness of the dielectric film 8 may be the same as or larger than the film thickness of the first electrode finger 6 and the second electrode finger 7.

In this preferred embodiment, the side surface 6*c* of the first electrode finger 6 and the side surface 7*c* of the second electrode finger 7 each extends to be inclined with respect to a normal direction of the piezoelectric substrate 2. Note that the side surface 6*c* of the first electrode finger 6 and the side surface 7*c* of the second electrode finger 7 may extend parallel or substantially parallel to the normal direction of the piezoelectric substrate 2.

Referring back to FIG. 1, by such a dielectric film 8 being provided, the acoustic velocity in the central region C is higher than the acoustic velocity in the first region E1 and the second region E2. That is, the acoustic velocity in the first region E1 and the second region E2 is lower than the acoustic velocity in the central region C. Here, assuming that the acoustic velocity in the central region C is Vc and the acoustic velocity in the first region E1 and the second region E2 is Ve, Vc>Ve is established. In this manner, the low acoustic velocity region L1 is configured in the first region E1, and the low acoustic velocity region L2 is configured in the second region E2.

As illustrated in FIG. 1, the IDT electrode 3 includes a first gap region G1 and a second gap region G2. The first gap region G1 is located between the first region E1 and the first busbar 4. The second gap region G2 is located between the second region E2 and the second busbar 5. In the first gap region G1, only the first electrode finger 6 is provided among the first electrode finger 6 and the second electrode finger 7. Therefore, an acoustic velocity in the first gap region G1 is higher than the acoustic velocity in the central region C. Similarly, in the second gap region G2, only the second electrode finger 7 is provided among the first electrode finger 6 and the second electrode finger 7. Therefore, an acoustic velocity in the second gap region G2 is higher than the acoustic velocity in the central region C. Here, assuming that the acoustic velocity in the first gap region G1 and the second gap region G2 is Vg, Vg>Vc is established. In this manner, the high acoustic velocity region H1 is configured in the first gap region G1, and the high acoustic velocity region H2 is configured in the second gap region G2.

In this preferred embodiment, the relationship between the acoustic velocities is Vg>Vc>Ve. Note that in a portion of FIG. 1 indicating the relation of the acoustic velocities, as indicated by an arrow V, the acoustic velocity increases as a line indicative of the magnitude of the acoustic velocity is located more left. From the center in the y direction, the central region C, the pair of low acoustic velocity regions L1 and L2, and the pair of high acoustic velocity regions H1 and H2 are arranged in this order. Therefore, a piston mode is achieved.

The dielectric film 8 may be a film with a relatively low acoustic velocity or a film with a relatively high acoustic velocity. Here, a certain film having a relatively low acoustic velocity means that an acoustic velocity of a bulk wave which propagates in the film is lower than an acoustic velocity of a bulk wave which propagates in the piezoelectric layer. A certain film having a relatively high acoustic velocity means that an acoustic velocity of a bulk wave which propagates in the film is higher than an acoustic velocity of a bulk wave which propagates in a piezoelectric layer.

When the dielectric film 8 is a relatively low acoustic velocity film, for example, silicon oxide, hafnium oxide, tantalum pentoxide, niobium pentoxide, or the like can be used as material of the dielectric film 8. When the dielectric film 8 is a relatively high acoustic velocity film, for example, aluminum oxide, silicon carbide, silicon nitride, silicon oxynitride, or the like can be used as material of the dielectric film 8.

Figure 3:
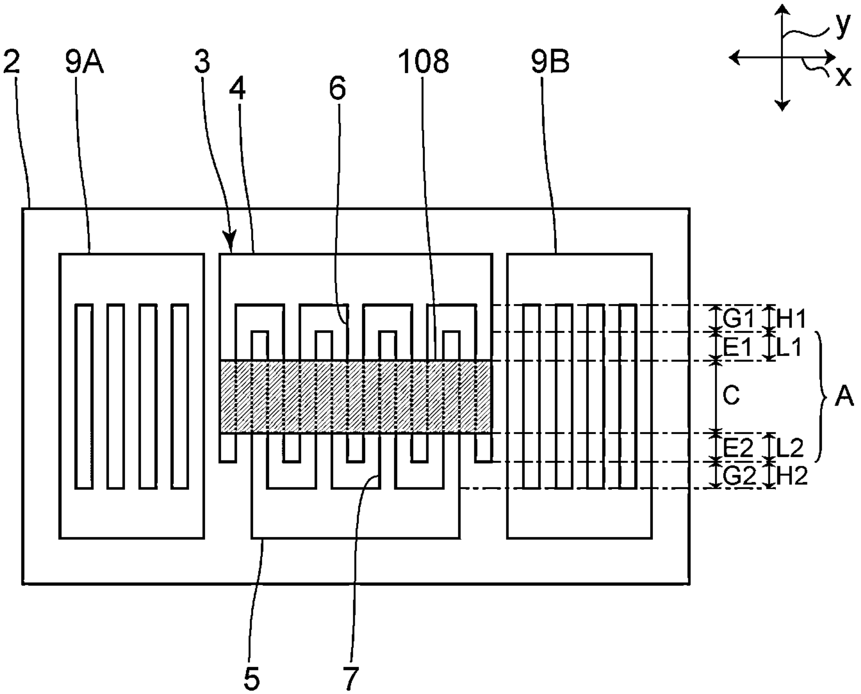
FIG. 3 is a plan view of an acoustic wave device according to Comparative Example 1.
Figure 4:
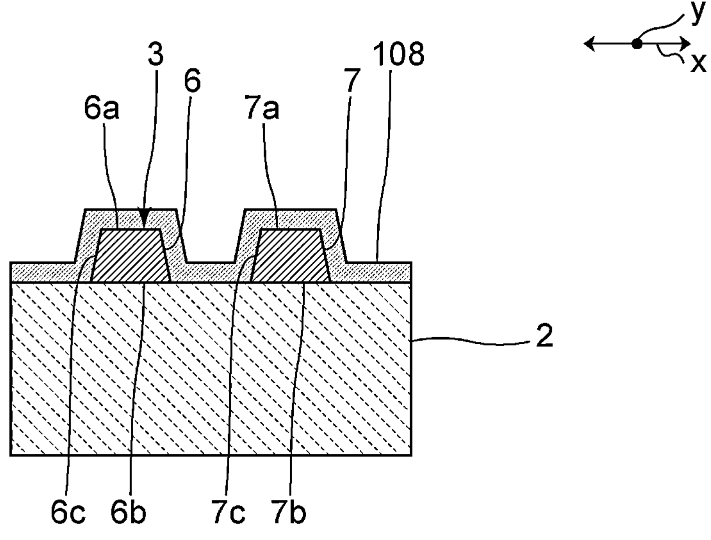
FIG. 4 is a front sectional view illustrating around a pair of electrode fingers of the acoustic wave device according to Comparative Example 1.

It is described below that, by the dielectric film 8 being provided, the difference in acoustic velocity between the central region C and the low acoustic velocity regions L1 and L2 can effectively be increased, while comparing this preferred embodiment to Comparative Example 1. As illustrated in FIG. 3, Comparative Example 1 is different from this preferred embodiment in that a dielectric film 108 overlaps with all of the plurality of electrode fingers in the central region C when seen in plan view. More specifically, as illustrated in FIG. 4, in Comparative Example 1, the dielectric film 108 covers the plurality of electrode fingers.

Assume that a ratio of the acoustic velocity Ve in the low acoustic velocity region L1 and the low acoustic velocity region L2 to the acoustic velocity Vc in the central region C is an acoustic velocity ratio Ve/Vc. In the acoustic wave device 1 in Preferred Embodiment 1 and the acoustic wave device in Comparative Example 1, a relationship between a film thickness of each of the dielectric film 8 and the dielectric film 108 and the acoustic velocity ratio Ve/Vc is examined. Note that based on Vc>Ve, Ve/Vc<1 is established. The smaller the value of the acoustic velocity ratio Ve/Vc is, the larger the difference in acoustic velocity between the central region C and the low acoustic velocity regions L1 and L2 is. Here, assume that a wavelength defined by an electrode finger pitch of the IDT electrode 3 is A. Herein, the film thickness may be represented by the wavelength A. Note that, as illustrated in FIG. 2, an electrode finger pitch p is a distance between centers of the adjacent electrode fingers. When the center distances of the adjacent electrode fingers in the IDT electrode 3 is not constant, an average value of the center distances may be used as the electrode finger pitch p. The wavelength $\lambda$ is represented by 2p. In Preferred Embodiment 1 in the following comparison, the wavelength $\lambda$ is about 2 $\mu$m, for example. Note that the value of the wavelength $\lambda$ is not limited to this.

Figure 5:
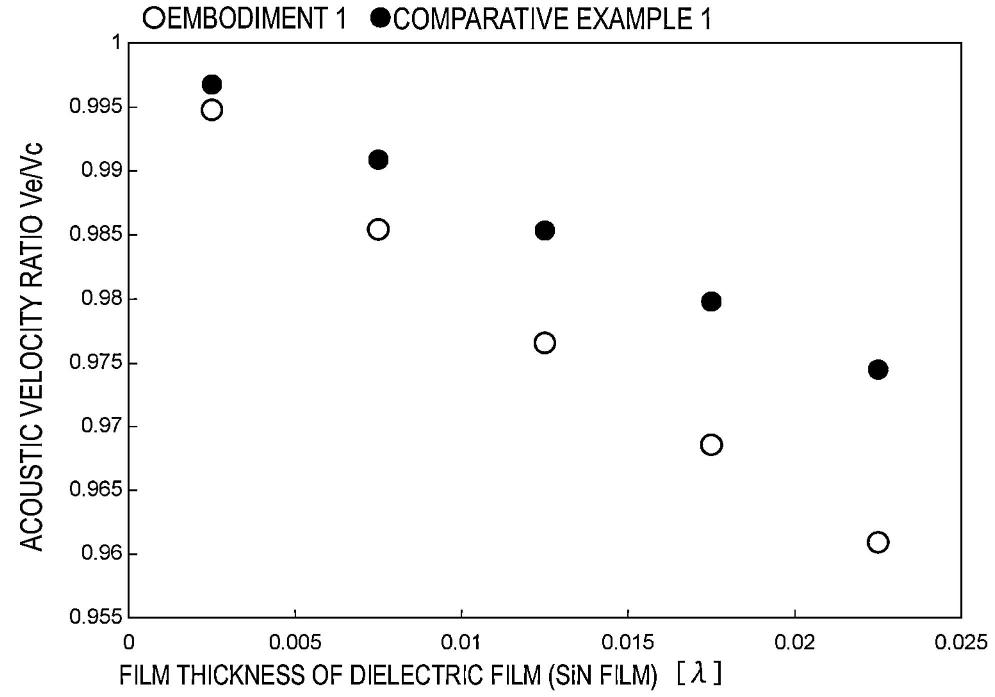
FIG. 5 is a diagram illustrating a relationship between a film thickness of a dielectric film and an acoustic velocity ratio Ve/Vc in the acoustic wave devices according to Preferred Embodiment 1 of the present invention and Comparative Example 1.

FIG. 5 is a diagram illustrating a relationship between the film thickness of the dielectric film and the acoustic velocity ratio Ve/Vc in the acoustic wave devices according to Preferred Embodiment 1 and Comparative Example 1. In FIG. 5, results in a case where the dielectric film 8 in Preferred Embodiment 1 and the dielectric film 108 in Comparative Example 1 are made of silicon nitride are illustrated. Herein, for example, the dielectric film 8 being made of silicon nitride includes a case where the dielectric film 8 contains a small amount of impurities other than silicon nitride. This is similarly applied to description relating to other configuration and material.

As illustrated in FIG. 5, it can be seen that the value of the acoustic velocity ratio Ve/Vc is smaller in Preferred Embodiment 1 than in Comparative Example 1. Further, as the film thickness of the dielectric film 8 and the dielectric film 108 is larger, the difference between the acoustic velocity ratio Ve/Vc in Preferred Embodiment 1 and the acoustic velocity ratio Ve/Vc in Comparative Example 1 is larger. As described above, in Preferred Embodiment 1, the difference in acoustic velocity between the central region C and the low acoustic velocity regions L1 and L2 can be increased effectively. Therefore, a transverse mode can effectively be suppressed.

The reasons for this can be considered as follows. A dielectric film may be used as a mass adding film. Mass addition has an effect to lower an acoustic velocity. An acoustic wave is excited by alternating-current voltage being applied by an electrode finger. Thus, when mass is added on the electrode finger, the acoustic velocity is more effectively lowered than when mass is added between the electrode fingers. Thereby, when the dielectric film is provided only between the electrode fingers like in Preferred Embodiment 1, the effect to lower the acoustic velocity is small.

Here, when the dielectric film is provided between the electrode fingers, electrostatic capacitance is larger than when the dielectric film is not provided between the electrode fingers. Thus, a fractional bandwidth becomes smaller, which is synonymous to the resonant frequency becoming higher. Assuming that the resonant frequency is f, the wavelength defined by the electrode finger pitch of the IDT electrode is $\lambda$, and the acoustic velocity is v, $f=v/\lambda$ is established. Since the electrode finger pitch is constant and the wavelength $\lambda$ is constant, the acoustic velocity v becomes higher as the resonant frequency f becomes higher. Therefore, it can be said that when the dielectric film is provided between the electrode fingers, there is an effect to increase the acoustic velocity.

Note that the effect to increase the acoustic velocity by the dielectric film 8 illustrated in FIG. 1 being provided between the electrode fingers and the effect to lower the acoustic velocity by mass addition have relation to offset with each other. In Preferred Embodiment 1, since the dielectric film 8 is provided only between the electrode fingers, the effect to lower the acoustic velocity is small. Therefore, the acoustic velocity in the central region C can effectively be increased.

In this preferred embodiment, a plurality of dielectric films 8 are provided. More specifically, each dielectric film 8 is provided to one space between the electrode fingers, and is not extended to a plurality of spaces between the electrode fingers. Note that, for example, one dielectric film may be extended to a plurality of spaces between electrode fingers and to the first surfaces or the second surfaces of the plurality of electrode fingers. It is enough that the dielectric film 8 is at least not overlapped with a portion of the plurality of electrode fingers when seen in plan view. Also in this case, the effect to lower the acoustic velocity by the mass addition can be suppressed. Therefore, a difference in acoustic velocity between the central region C and the low acoustic velocity regions L1 and L2 can effectively be increased.

Figure 6:
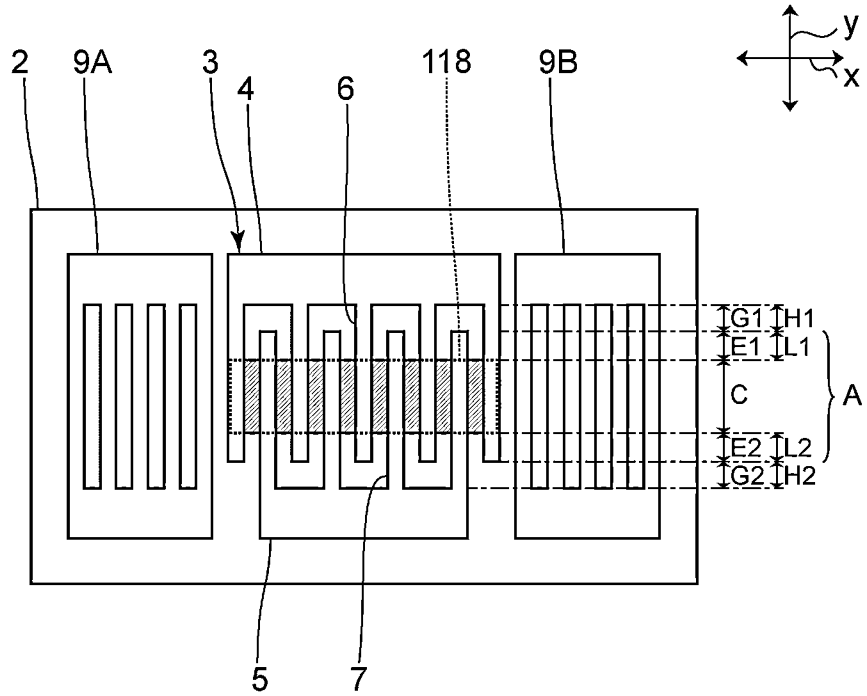
FIG. 6 is a plan view of an acoustic wave device according to Comparative Example 2.

Conventionally, when a relatively low acoustic velocity film is used as the dielectric film provided to the central region, it is considered that the acoustic velocity in the central region cannot be increased. In this respect, in Preferred Embodiment 1 illustrated in FIG. 1, even when the dielectric film 8 is a relatively low acoustic velocity film, the acoustic velocity Vc in the central region C can effectively be increased. This will be described below while comparing Preferred Embodiment 1 to Comparative Example 1 and Comparative Example 2. As illustrated in FIG. 6, Comparative Example 2 is different from Preferred Embodiment 1 in that a dielectric film 118 is provided between the piezoelectric substrate 2 and the IDT electrode 3 over the entire central region C. Note that, in FIG. 7 described below, the acoustic velocity Vc in Comparative Example 3 without a dielectric film is also illustrated together.

Figure 7:
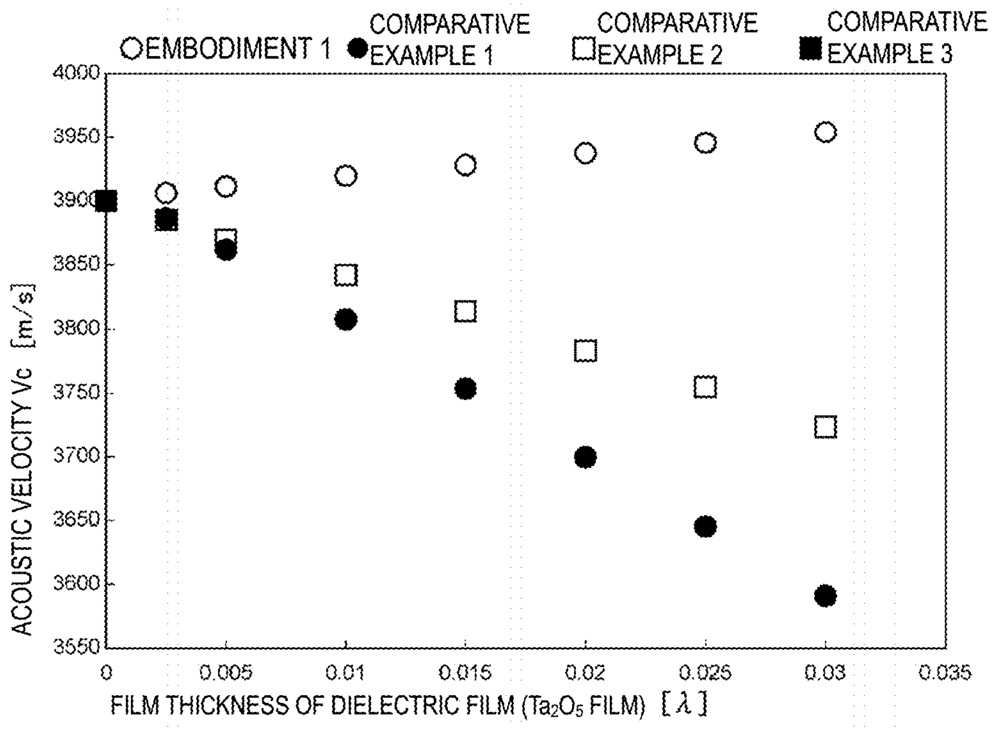
FIG. 7 is a diagram illustrating a relationship between a film thickness of a dielectric film and an acoustic velocity Vc in acoustic wave devices according to Preferred Embodiment 1 of the present invention and Comparative Examples 1 to 3.

FIG. 7 is a diagram illustrating a relationship between the film thickness of the dielectric film and the acoustic velocity Vc in the acoustic wave devices according to Preferred Embodiment 1 and Comparative Examples 1 to 3. In FIG. 7, results in a case where the dielectric film 8 in Preferred Embodiment 1, the dielectric film 108 in Comparative Example 1, and the dielectric film 118 in Comparative Example 2 are made of tantalum pentoxide are illustrated. In Comparative Example 3, a film thickness of a dielectric film is zero. Note that the film thickness of the dielectric film being zero means that the dielectric film is not provided.

Figure 8:
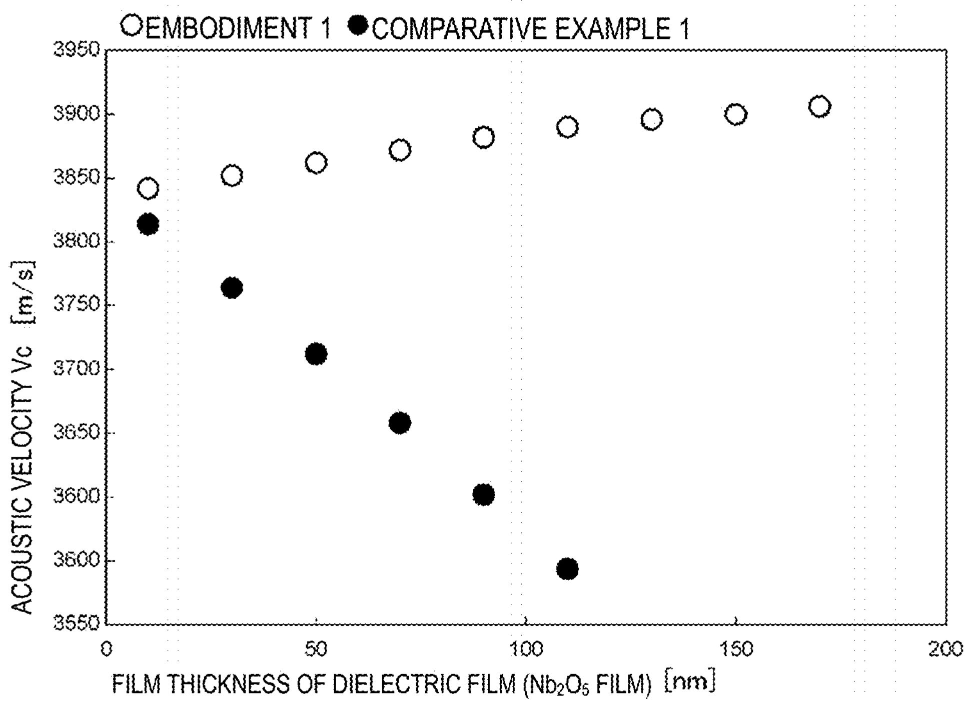
FIG. 8 is a diagram illustrating a relationship between the film thickness of the dielectric film and the acoustic velocity Vc in the acoustic wave devices according to Preferred Embodiment 1 of the present invention and Comparative Example 1.

As illustrated in FIG. 7, in Comparative Example 1 and Comparative Example 2, the acoustic velocity Vc in the central region C is lower than that in Comparative Example 3 without a dielectric film. Note that, in Comparative Example 1, the acoustic velocity Vc lowers as the film thickness of the dielectric film 108 increases, which is similar in Comparative Example 2. On the other hand, in Preferred Embodiment 1, it can be seen that the acoustic velocity Vc is higher than that in Comparative Example 3. Note that, in Preferred Embodiment 1, the acoustic velocity Vc increases as the film thickness of the dielectric film 8 increases. As described above, in Preferred Embodiment 1, the acoustic velocity Vc can be increased although the dielectric film 8 is the relatively low acoustic velocity film. FIG. 8 described below illustrates an example in which material other than tantalum pentoxide is used as the relatively low acoustic velocity film.

FIG. 8 is a diagram illustrating a relationship between the film thickness of the dielectric film and the acoustic velocity Vc in the acoustic wave devices according to Preferred Embodiment 1 and Comparative Example 1. In FIG. 8, results in a case where the dielectric film 8 in Preferred Embodiment 1 and the dielectric film 108 in Comparative Example 1 are made of niobium pentoxide are illustrated.

As illustrated in FIG. 8, in Comparative Example 1, the acoustic velocity Vc in the central region C lowers as the film thickness of the dielectric film 108 increases. On the other hand, in Preferred Embodiment 1, similarly to the example illustrated in FIG. 7, it can be seen that the acoustic velocity Vc increases as the film thickness of the dielectric film 8 increases.

Meanwhile, the dielectric film 8 in Preferred Embodiment 1 can be formed by a lift-off method, for example. Specifically, as illustrated in FIG. 9A, a resist pattern 13A is formed on the plurality of first electrode fingers 6 and the plurality of second electrode fingers 7 by photolithography method or the like. At this time, the resist pattern 13A has an aperture at a portion overlapping with the range between the electrode fingers when seen in plan view. Next, as illustrated in FIG. 9B, a dielectric layer 13B is formed to cover the resist pattern 13A and the piezoelectric substrate 2. Then, by the resist pattern 13A being peeled off, the dielectric film 8 as illustrated in FIG. 2 can be obtained.

A plurality of modifications of Preferred Embodiment 1 are described below. In each modification, similarly to Preferred Embodiment 1, a difference in acoustic velocity between the central region C and the low acoustic velocity regions L1 and L2 can effectively be increased, and a transverse mode can effectively be suppressed.

In Modification 1 illustrated in FIG. 10, a dielectric film 8A is not in contact with the side surface 6*c* of the first electrode finger 6 and the side surface 7*c* of the second electrode finger 7. Here, a dimension of the dielectric film 8A in the x direction is assumed to be a width of the dielectric film 8A. The width of the dielectric film 8A is the same as a dimension corresponding to a distance between a ridge line portion of the side surface 6*c* and the second surface 6*b* of the first electrode finger 6 and a ridge line portion of the side surface 7*c* and the second surface 7*b* of the second electrode finger 7. Therefore, the dielectric film 8A is in contact with both of the above-described ridge line portions. Note that herein a ridge line portion of the side surface and another surface is not included in the side surface.

Figure 11:
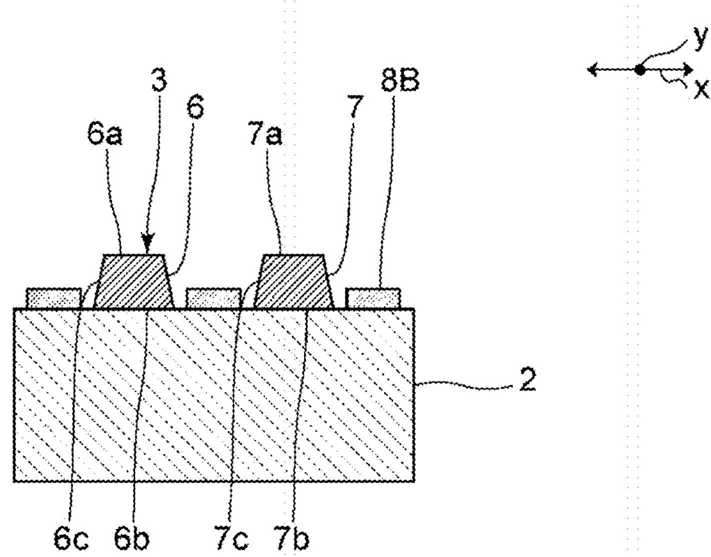
FIG. 11 is a front sectional view illustrating around a pair of electrode fingers of an acoustic wave device according to Modification 2 of Preferred Embodiment 1 of the present invention.

In Modification 2 illustrated in FIG. 11, a dielectric film 8B is not in contact with the first electrode finger 6 and the second electrode finger 7. A width of the dielectric film 8B is smaller than a dimension corresponding to a distance between the ridge line portion of the side surface 6*c* and the second surface 6*b* of the first electrode finger 6 and the ridge line portion of the side surface 7*c* and the second surface 7*b* of the second electrode finger 7.

Note that, similarly Preferred Embodiment 1 illustrated in FIG. 2, it is preferable that the dielectric film 8 is in contact with the side surface 6*c* of the first electrode finger 6 and the side surface 7*c* of the second electrode finger 7. As a result, the acoustic velocity Vc in the central region C can further be increased. This will be described while comparing Preferred Embodiment 1 to Modification 1 thereof.

Figure 12:
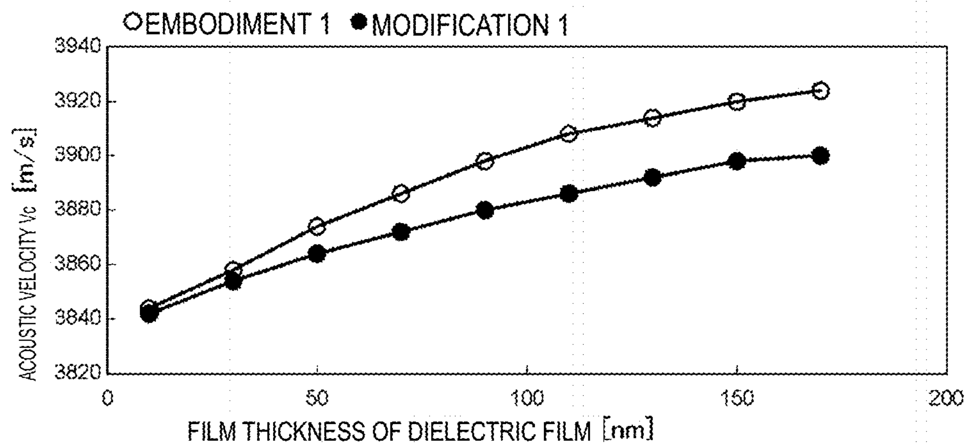
FIG. 12 is a diagram illustrating a relationship between the film thickness of the dielectric film and the acoustic velocity Vc in the acoustic wave devices according to Preferred Embodiment 1 of the present invention and Modification 1 of Preferred Embodiment 1 of the present invention.

FIG. 12 is a diagram illustrating a relationship between the film thickness of the dielectric film and the acoustic velocity Vc in the acoustic wave devices according to Preferred Embodiment 1 and Modification 1 thereof.

As illustrated in FIG. 12, in both of Preferred Embodiment 1 and Modification 1 thereof, it can be seen that the acoustic velocity Vc in the central region C increases as the film thickness of the dielectric film 8 and the dielectric film 8A increases. Further, in Preferred Embodiment 1, it can be seen that the acoustic velocity Vc is higher than in Modification 1.

Figure 13:
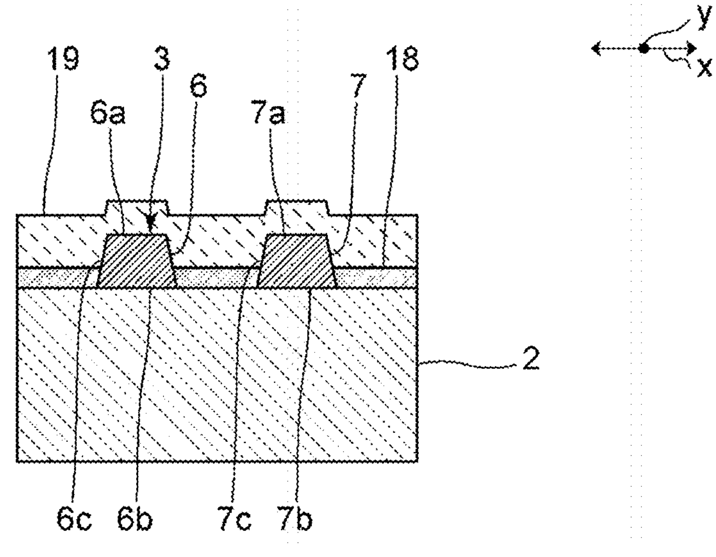
FIG. 13 is a front sectional view illustrating around a pair of electrode fingers of an acoustic wave device according to Modification 3 of Preferred Embodiment 1 of the present invention.

Here, in Modification 3 illustrated in FIG. 13, a dielectric film corresponding to the dielectric film 8 in Preferred Embodiment 1 is a first dielectric film 18. A second dielectric film 19 is provided on the piezoelectric substrate 2 so as to cover the IDT electrode 3 and the first dielectric film 18. The second dielectric film 19 is made of, for example, silicon oxide, silicon nitride, silicon oxynitride, or the like. By the second dielectric film 19 being provided, the entire IDT electrode 3 is protected by the dielectric film, thus the IDT electrode 3 being unlikely to be damaged by humidity. Moreover, by a thickness of the second dielectric film 19 being adjusted, a resonant frequency can be adjusted.

Note that the second dielectric film 19 is provided with a convex portion at a portion overlapping with the first electrode finger 6 or the second electrode finger 7 when seen in plan view. Note that the second dielectric film 19 is not necessarily provided with the convex portion. The second dielectric film 19 may be flat.

Figure 14:
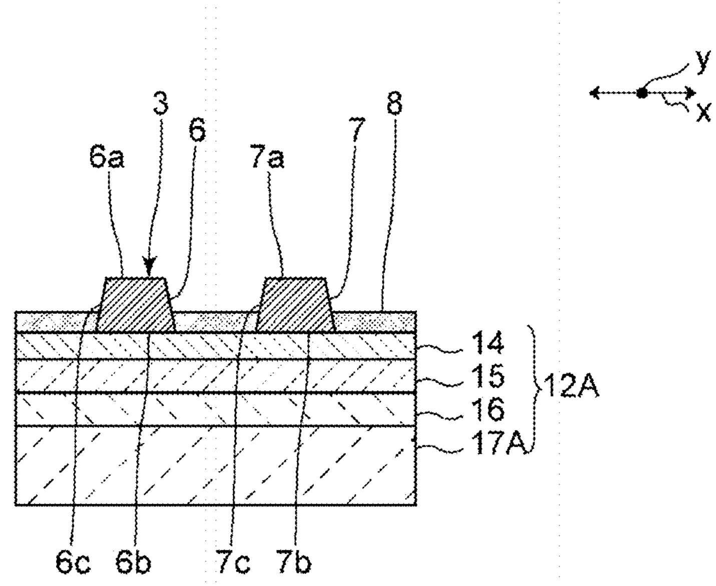
FIG. 14 is a front sectional view illustrating around a pair of electrode fingers of an acoustic wave device according to Modification 4 of Preferred Embodiment 1 of the present invention.

In Modification 4 illustrated in FIG. 14, a piezoelectric substrate 12A includes a support substrate 17A, a first intermediate film 15, a second intermediate film 16, and a piezoelectric layer 14. More specifically, the second intermediate film 16 is provided on the support substrate 17A. The first intermediate film 15 is provided on the second intermediate film 16. The piezoelectric layer 14 is provided on the first intermediate film 15.

As material of the first intermediate film 15, for example, material whose major constituent is glass, silicon oxide, silicon oxynitride, lithium oxide, tantalum pentoxide, or a chemical compound in which fluorine, carbon, and boron are added to silicon oxide can be used.

As material of the second intermediate film 16, for example, a medium whose major constituent is a material such as silicon, aluminum oxide, silicon carbide, silicon nitride, silicon oxynitride, sapphire, lithium tantalate, lithium niobate, quartz, alumina, zirconia, cordierite, mullite, steatite, forsterite, magnesia, a diamond-like carbon (DLC) film, or diamond can be used. Note that it is preferable that the second intermediate film 16 is made of at least one material selected from the group consisting of aluminum nitride, aluminum oxide, silicon nitride, and a DLC film.

As material of the support substrate 17A, for example, piezoelectric material (for example, aluminum oxide, lithium tantalate, lithium niobate, and quartz), various ceramics (for example, alumina, sapphire, magnesia, silicon nitride, aluminum nitride, silicon carbide, zirconia, cordierite, mullite, steatite, and forsterite), a dielectric (for example, diamond and glass), a semiconductor (for example, silicon and gallium nitride), a resin, or the like can be used.

In this modification, the first intermediate film 15 is a low acoustic velocity film. The low acoustic velocity film is a relatively low acoustic velocity film. More specifically, an acoustic velocity of a bulk wave which propagates in the low acoustic velocity film is lower than an acoustic velocity of a bulk wave which propagates in the piezoelectric layer 14.

In this modification, the second intermediate film 16 is a high acoustic velocity film as a high acoustic velocity material layer. The high acoustic velocity material layer is a relatively high acoustic velocity layer. Note that, in the case of the high acoustic velocity material layer, a target of comparison is an acoustic velocity of an acoustic wave which propagates in the piezoelectric layer 14. More specifically, an acoustic velocity of a bulk wave which propagates in the high acoustic velocity material layer is higher than the acoustic velocity of the acoustic wave which propagates in the piezoelectric layer 14.

In the piezoelectric substrate 12A according to this modification, the high acoustic velocity film as the high acoustic velocity material layer, the low acoustic velocity film, and the piezoelectric layer 14 are laminated in this order. Therefore, energy of the acoustic wave can effectively be confined on the piezoelectric layer 14 side.

Figure 15:
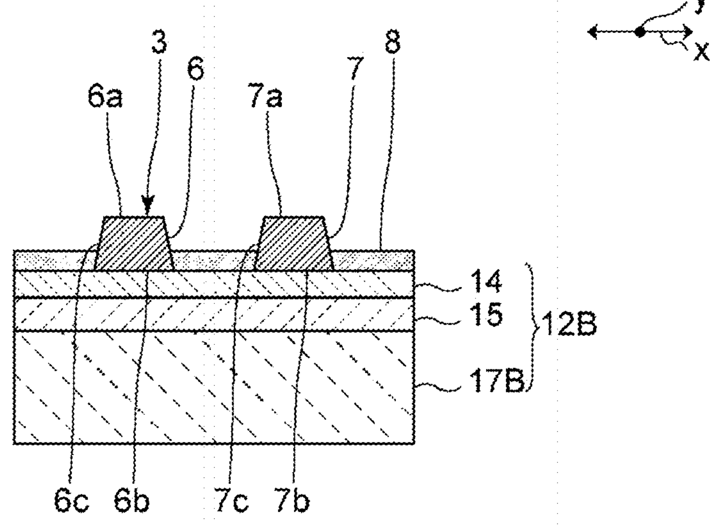
FIG. 15 is a front sectional view illustrating around a pair of electrode fingers of an acoustic wave device according to Modification 5 of Preferred Embodiment 1 of the present invention.

In Modification 5 illustrated in FIG. 15, a piezoelectric substrate 12B includes a substrate 17B, the first intermediate film 15, and the piezoelectric layer 14. More specifically, the first intermediate film 15 is provided on the substrate 17B. The piezoelectric layer 14 is provided on the first intermediate film 15.

As material of the substrate 17B, for example, a medium whose major constituent is a material such as silicon, aluminum oxide, silicon carbide, silicon nitride, silicon oxynitride, sapphire, lithium tantalate, lithium niobate, quartz, alumina, zirconia, cordierite, mullite, steatite, forsterite, magnesia, a DLC film, or diamond can be used. Note that it is preferable that the substrate 17B is made of at least one material selected from the group consisting of sapphire, quartz, silicon carbide, and silicon.

In this modification, the substrate 17B is a high acoustic velocity support substrate as a high acoustic velocity material layer. Also in this modification, similarly to Modification 4, the energy of the acoustic wave can effectively be confined on the piezoelectric layer 14 side.

Note that, in Modification 4 and Modification 5, the piezoelectric layer 14 is indirectly provided on the high acoustic velocity material layer as the substrate 17B or the second intermediate film 16 with the low acoustic velocity film as the first intermediate film 15 interposed therebetween. Note that the first intermediate film 15 is not necessarily provided. The piezoelectric layer 14 may directly be provided on the substrate 17B or the second intermediate film 16. For example, the piezoelectric substrate may be a multilayer body of the support substrate 17A, the second intermediate film 16, and the piezoelectric layer 14, or a multilayer body of the substrate 17B and the piezoelectric layer 14. Also in these cases, energy of the acoustic wave can effectively be confined on the piezoelectric layer 14 side.

Note that the piezoelectric substrate may be a multilayer body of an acoustic reflection film and a piezoelectric layer. The acoustic reflection film includes at least one low acoustic impedance layer and at least one high acoustic impedance layer. The low acoustic impedance layer is a layer having a relatively low acoustic impedance. The high acoustic impedance layer is a layer having a relatively high acoustic impedance. The low acoustic impedance layer and the high acoustic impedance layer are laminated alternately. Also in this case, the energy of the acoustic wave can effectively be confined on the piezoelectric layer side. Further, similarly to Preferred Embodiment 1, a difference in acoustic velocity between the central region and the low acoustic velocity region can effectively be increased, and a transverse mode can effectively be suppressed.

Figure 16:
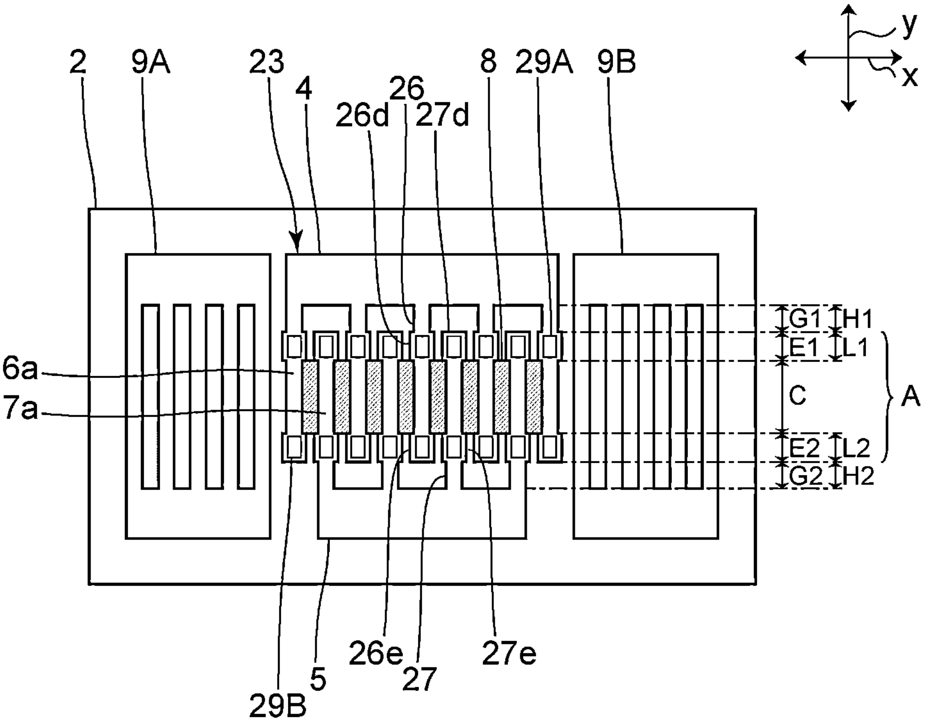
FIG. 16 is a plan view of an acoustic wave device according to Preferred Embodiment 2 of the present invention.

FIG. 16 is a plan view of an acoustic wave device according to Preferred Embodiment 2.

This preferred embodiment is different from Preferred Embodiment 1 in terms of configuration of an IDT electrode 23 in the first region E1 and the second region E2 and in that a mass adding film 29A and a mass adding film 29B are provided. In the acoustic wave device in this preferred embodiment, configurations other than the above are similar to the acoustic wave device 1 in Preferred Embodiment 1.

Each first electrode finger 26 of the IDT electrode 23 includes a wide portion 26*d* and a wide portion 26*e*. The wide portion 26*d* is located in the first region E1. The wide portion 26*e* is located in the second region E2. Assuming that a dimension of the electrode finger in the x direction is a width of the electrode finger, a width of the first electrode finger 26 at the wide portion 26*d* and at the wide portion 26*e* is larger than a width of the first electrode finger 26 in the central region C. Similarly, each second electrode finger 27 includes a wide portion 27*d* and a wide portion 27*e*. The wide portion 27*d* is located in the first region E1. The wide portion 27*e* is located in the second region E2. A width of the second electrode finger 27 at the wide portion 27*d* and at the wide portion 27*e* is larger than a width of the second electrode finger 27 in the central region C.

By the IDT electrode 23 being provided with the wide portion 26*d*, the wide portion 26*e*, the wide portion 27*d*, and the wide portion 27*e*, the acoustic velocity Ve in the first region E1 and the second region E2 can be lowered. That is, the acoustic velocity Ve in the low acoustic velocity region L1 and the low acoustic velocity region L2 configured in the first region E1 and the second region E2 can be lowered.

Note that it is enough that at least one finger of the plurality of first electrode fingers 26 and the plurality of second electrode fingers 27 includes the wide portion in at least one of the first region E1 and the second region E2. Note that it is preferable that the plurality of electrode fingers include the wide portions. The plurality of first electrode fingers 26 may include both of the electrode finger having the wide portion 26*d* or the wide portion 26*e* and the electrode finger not having the wide portion 26*d* and the wide portion 26*e*. Similarly, the plurality of second electrode fingers 27 may include both of the electrode finger having the wide portion 27*d* or the wide portion 27*e* and the electrode finger not having the wide portion 27*d* and the wide portion 27*e*.

Furthermore, as illustrated in FIG. 16, in the first region E1, the plurality of first electrode fingers 26 and the plurality of second electrode fingers 27 are provided with a plurality of mass adding films 29A. More specifically, the mass adding films 29A are provided on the first surfaces 6*a* of the respective first electrode fingers 26, and the first surfaces 7*a* of the respective second electrode fingers 27. Similarly, in the second region E2, the plurality of first electrode fingers 26 and the plurality of second electrode fingers 27 are provided with a plurality of mass adding films 29B. More specifically, the mass adding films 29B are provided on the first surfaces 6*a* of the respective first electrode fingers 26, and the first surfaces 7*a* of the respective second electrode fingers 27. Also, by the mass adding film 29A and the mass adding film 29B being provided, the acoustic velocity Ve in the first region E1 and the second region E2 can be lowered.

Note that it is enough that at least one of the mass adding film 29A and the mass adding film 29B is provided to at least one finger of the plurality of first electrode fingers 26 and the plurality of second electrode fingers 27. Note that it is preferable that the plurality of mass adding films 29A and the plurality of mass adding films 29B are provided to the plurality of electrode fingers. The plurality of mass adding films 29A and the plurality of mass adding films 29B are made of suitable metal or dielectric.

Meanwhile, in the central region C, similarly to Preferred Embodiment 1, the dielectric film 8 is provided between the plurality of electrode fingers, and the dielectric film 8 does not overlap with at least a portion of the plurality of electrode fingers when seen in plan view. Therefore, the acoustic velocity Vc in the central region can effectively be increased. Thus, in this preferred embodiment, a difference in acoustic velocity between the central region C and the low acoustic velocity regions L1 and L2 can further be increased. As a result, a transverse mode can be suppressed more securely.

In this preferred embodiment, the mass adding film 29A and the mass adding film 29B are not provided to a portion between the electrode fingers on the piezoelectric substrate 2. Note that the mass adding film 29A and the mass adding film 29B may be provided to the portion between the electrode fingers on the piezoelectric substrate 2. One mass adding film 29A and one mass adding film 29B may cover the plurality of first electrode fingers 26 and the plurality of second electrode fingers 27. In this case, the mass adding film 29A and the mass adding film 29B are made of a suitable dielectric.

The acoustic velocity in the first region E1 and the second region E2 may be lowered by one of the configuration in which the wide portion is provided and the configuration in which the mass adding film is provided.

Figure 17:
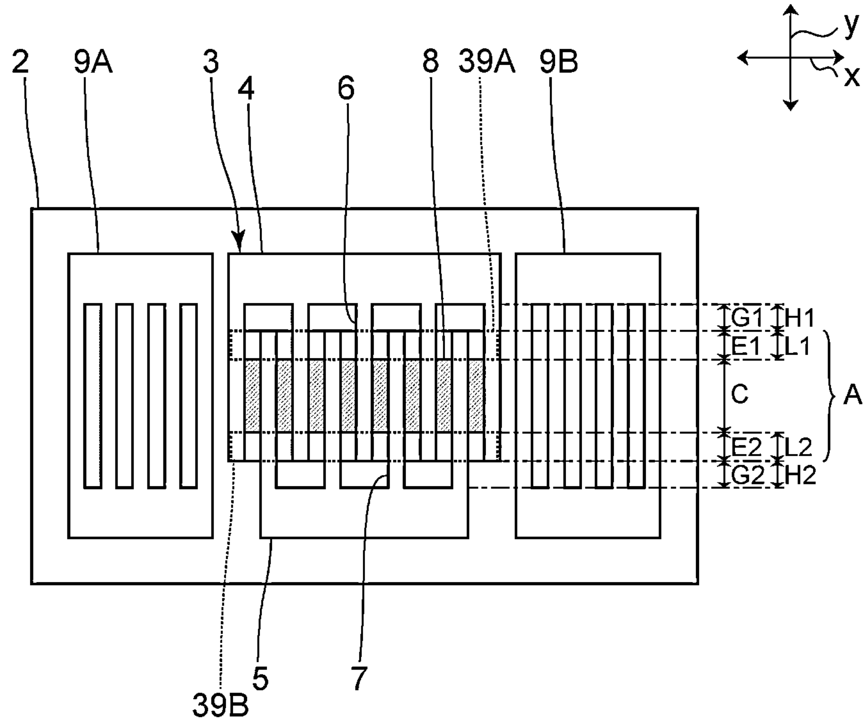
FIG. 17 is a plan view of an acoustic wave device according to Preferred Embodiment 3 of the present invention.

FIG. 17 is a plan view of an acoustic wave device according to Preferred Embodiment 3.

This preferred embodiment is different from Preferred Embodiment 1 in that a mass adding film 39A and a mass adding film 39B are provided in the first region E1 and the second region E2. In the acoustic wave device in this preferred embodiment, configurations other than the above are similar to the acoustic wave device 1 in Preferred Embodiment 1.

The mass adding film 39A and the mass adding film 39B have a band shape. One mass adding film 39A is provided between the piezoelectric substrate 2 and the plurality of electrode fingers in the first region E1. One mass adding film 39B is provided between the piezoelectric substrate 2 and the plurality of electrode fingers in the second region E2. The mass adding film 39A and the mass adding film 39B are made of a suitable dielectric.

By the mass adding film 39A and the mass adding film 39B being provided, the acoustic velocity Ve in the first region E1 and the second region E2 can be lowered. In addition, in the central region C, the dielectric film 8 is provided between the plurality of electrode fingers, and the dielectric film 8 does not overlap with at least a portion of the plurality of electrode fingers when seen in plan view. Therefore, the acoustic velocity Vc in the central region C can be increased. Thus, in this preferred embodiment, a difference in acoustic velocity between the central region C and the low acoustic velocity regions L1 and L2 can further be increased. As a result, a transverse mode can be suppressed more securely.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric substrate including a piezoelectric layer; and an IDT electrode which is provided on the piezoelectric layer and includes:

a first busbar and a second busbar opposed to each other; and a plurality of electrode fingers each including one end connected to one of the first busbar and the second busbar; wherein a portion of the IDT electrode in which at least one of the electrode fingers connected to the first busbar and at least one of the electrode fingers connected to the second busbar overlap with each other in a propagation direction of an acoustic wave is an intersecting region, the electrode fingers being adjacent to each other;

the intersecting region includes a central region located on a center side in an extending direction of the plurality of electrode fingers, and a first region and a second region located on respective sides of the central region in the extending direction of the plurality of electrode fingers;

the acoustic wave device further includes a dielectric film located in the central region; and in the central region, the dielectric film is provided between the plurality of electrode fingers, and, in the central region, the dielectric film does not overlap with at least a portion of the plurality of electrode fingers when seen in plan view.

2. The acoustic wave device according to claim 1, wherein a portion located between the intersecting region and the first busbar is a first gap region, and a portion located between the intersecting region and the second busbar is a second gap region; and an acoustic velocity in the first region and the second region is lower than an acoustic velocity in the central region, and an acoustic velocity in the first gap region and the second gap region is higher than the acoustic velocity in the central region.

3. The acoustic wave device according to claim 1, wherein each of the plurality of electrode fingers includes a first surface and a second surface opposed to each other in a thickness direction; and the dielectric film is not in contact with the first surface and the second surface in the central region.

4. The acoustic wave device according to claim 1, wherein each of the plurality of electrode fingers includes a first surface and a second surface opposed to each other in a thickness direction, and a side surface connected to the first surface and the second surface; and the dielectric film is in contact with the side surfaces of the electrode fingers adjacent to each other.

5. The acoustic wave device according to claim 1, wherein a film thickness of the dielectric film is smaller than a film thickness of the plurality of electrode fingers.

6. The acoustic wave device according to claim 1, wherein an acoustic velocity of a bulk wave that propagates in the dielectric film is lower than an acoustic velocity of a bulk wave that propagates in the piezoelectric layer.

7. The acoustic wave device according to claim 1, wherein the dielectric film is made of tantalum pentoxide.

8. The acoustic wave device according to claim 1, wherein an acoustic velocity of a bulk wave that propagates in the dielectric film is higher than an acoustic velocity of a bulk wave that propagates in the piezoelectric layer.

9. The acoustic wave device according to claim 1, wherein the dielectric film is a first dielectric film; and the acoustic wave device further includes a second dielectric film covering at least a portion of the IDT electrode and the first dielectric film.

10. The acoustic wave device according to claim 1, wherein the plurality of electrode fingers include a plurality of first electrode fingers each including one end connected to the first busbar, and a plurality of second electrode fingers each including one end connected to the second busbar; and at least one finger of the plurality of first electrode fingers and the plurality of second electrode fingers has a wide portion in at least one of the first region and the second region, and a width of the electrode finger at the wide portion is larger than a width of the electrode finger in the central region.

11. The acoustic wave device according to claim 1, wherein the plurality of electrode fingers include a plurality of first electrode fingers each including one end connected to the first busbar, and a plurality of second electrode fingers each including one end connected to the second busbar; and at least one finger of the plurality of first electrode fingers and the plurality of second electrode fingers is provided with a mass adding film in at least one of the first region and the second region.

12. The acoustic wave device according to claim 1, wherein the piezoelectric substrate includes a high acoustic velocity material layer and a low acoustic velocity film provided on the high acoustic velocity material layer, and the piezoelectric layer is provided on the low acoustic velocity film;

an acoustic velocity of a bulk wave that propagates in the high acoustic velocity material layer is higher than an acoustic velocity of an acoustic wave that propagates in the piezoelectric layer; and an acoustic velocity of a bulk wave that propagates in the low acoustic velocity film is lower than an acoustic velocity of a bulk wave that propagates in the piezoelectric layer.

13. The acoustic wave device according to claim 12, wherein the high acoustic velocity material layer is a high acoustic velocity support substrate.

14. The acoustic wave device according to claim 12, wherein the piezoelectric substrate includes a support substrate; and the high acoustic velocity material layer is a high acoustic velocity film provided on the support substrate.

15. The acoustic wave device according to claim 1, wherein the piezoelectric substrate includes a substrate and a first intermediate film, the first intermediate film is provided on the substrate, and the piezoelectric layer is provided on the first intermediate film;

the piezoelectric layer is made of lithium tantalate or lithium niobate;

the first intermediate film is made of silicon oxide; and the substrate is made of at least one material selected from a group consisting of sapphire, quartz, silicon carbide, and silicon.

16. The acoustic wave device according to claim 1, wherein the piezoelectric substrate includes a support substrate, a first intermediate film, and a second intermediate film, the second intermediate film is provided on the support substrate, the first intermediate film is provided on the second intermediate film, and the piezoelectric layer is provided on the first intermediate film;

the piezoelectric layer is made of lithium tantalate or lithium niobate;

the first intermediate film is made of silicon oxide; and the second intermediate film is made of at least one material selected from a group consisting of aluminum nitride, aluminum oxide, silicon nitride, and a DLC film.

17. The acoustic wave device according to claim 2, wherein each of the plurality of electrode fingers includes a first surface and a second surface opposed to each other in a thickness direction; and the dielectric film is not in contact with the first surface and the second surface in the central region.

18. The acoustic wave device according to claim 2, wherein each of the plurality of electrode fingers includes a first surface and a second surface opposed to each other in a thickness direction, and a side surface connected to the first surface and the second surface; and the dielectric film is in contact with the side surfaces of the electrode fingers adjacent to each other.

19. The acoustic wave device according to claim 2, wherein a film thickness of the dielectric film is smaller than a film thickness of the plurality of electrode fingers.

20. The acoustic wave device according to claim 3, wherein each of the plurality of electrode fingers includes a first surface and a second surface opposed to each other in a thickness direction, and a side surface connected to the first surface and the second surface; and the dielectric film is in contact with the side surfaces of the electrode fingers adjacent to each other.

* * * * *